United States Patent
Arik et al.

(10) Patent No.: US 7,489,132 B2
(45) Date of Patent: Feb. 10, 2009

(54) ENHANCED HEAT TRANSFER IN MRI GRADIENT COILS WITH PHASE-CHANGE MATERIALS

(75) Inventors: Mehmet Arik, Niskayuna, NY (US); Michael Kent Cueman, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 111 days.

(21) Appl. No.: 11/611,432

(22) Filed: Dec. 15, 2006

(65) Prior Publication Data

US 2008/0143331 A1 Jun. 19, 2008

(51) Int. Cl.
*G01V 3/00* (2006.01)

(52) U.S. Cl. .................. 324/318; 324/322; 324/315; 324/309

(58) Field of Classification Search ......... 324/300–322; 600/407–435
See application file for complete search history.

(56) References Cited

U.S. PATENT DOCUMENTS

| | | | |
|---|---|---|---|
| 2004/0119472 A1* | 6/2004 | Laskaris et al. | 324/318 |
| 2005/0001621 A1* | 1/2005 | Laskaris et al. | 324/318 |
| 2005/0030028 A1* | 2/2005 | Clarke et al. | 324/318 |
| 2005/0035764 A1* | 2/2005 | Mantone et al. | 324/318 |
| 2005/0146330 A1* | 7/2005 | Teklemariam et al. | 324/318 |
| 2006/0066309 A1* | 3/2006 | Arik et al. | 324/318 |
| 2006/0220646 A1* | 10/2006 | Kurome et al. | 324/318 |
| 2006/0279285 A1* | 12/2006 | Morita et al. | 324/318 |
| 2007/0066883 A1* | 3/2007 | Kimmlingen et al. | 600/410 |
| 2007/0080689 A1* | 4/2007 | Konijn et al. | 324/318 |

* cited by examiner

*Primary Examiner*—Diego Gutierrez
*Assistant Examiner*—Tiffany A Fetzner
(74) *Attorney, Agent, or Firm*—Eileen W. Gallagher

(57) ABSTRACT

An MRI apparatus includes a MRI gradient coil and an MRI cooling system. The MRI cooling system is thermally connected to the MRI gradient coil and includes a cooling circuit. A chiller is connected to the cooling circuit and configured to pump a coolant through the cooling circuit and extract heat from the coolant. The coolant includes both a carrier fluid and a phase-change material.

21 Claims, 2 Drawing Sheets

ENHANCED HEAT TRANSFER IN MRI GRADIENT COILS WITH PHASE-CHANGE MATERIALS

BACKGROUND OF THE INVENTION

The present invention relates generally to magnetic resonance imaging (MRI) systems and, more particularly, to minimizing temperature variation throughout a cooling system of a gradient coil of an MRI system leading to lower coil temperatures. The present invention is also related to minimizing the size and components of a cooling system for a gradient coil of an MRI system, and reducing pumping requirements for coolant within a gradient coil of an MRI system.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Many MR systems use gradient coils in which a coolant flows therethrough. A chiller utilizing water or a water and ethylene glycol mixture, or a coolant having dielectric or non-dielectric fluid mixtures, is typically used for removing heat from gradient coils and from both primary and shield parts. As power requirements for MR systems increase, the complexity of the thermal design has increased as well. Typically an MR system can generate significant amounts of heat, which can be 15-20 kW, and future devices are expected to increase up to 100 kW or more. Additionally, as a coolant flows through the cooling channels of MR gradient coils, the temperature rise of the coolant can be substantial, which in turn could cause hot spots in the MR gradient coils and potentially degrade system performance. Because the coolant is distributed throughout a series of sub-circuits, flow can stagnate in portions of the overall flow circuit, or flow non-uniformly due to pressure non-uniformities, thus depriving portions of the gradient coils and further causing hot spots to form within the gradient coils. Common solutions to increasing cooling requirements within MR systems are to either provide more cooling circuitry or to increase the flow rate within the gradient coils. Both solutions can have practical limitations for increasing cooling requirements, such as additional design complexity, pressure drop, and reliability concerns.

It would therefore be desirable to have a system and method capable of having a large cooling capacity and having a uniform pressure drop throughout an MR gradient cooling system. It would further be desirable to have a system and method capable of having a uniform temperature of a coolant throughout an MR gradient cooling system.

BRIEF DESCRIPTION OF THE INVENTION

The present invention provides a system and method of cooling an MR system that overcomes the aforementioned drawbacks. A phase-change material is provided within a carrier fluid, the combination of which is circulated through a cooling system thermally connected to the MR gradient coils of an MR system.

In accordance with one aspect of the invention, an MRI apparatus includes a MRI gradient coil and an MRI cooling system. The MRI cooling system is thermally connected to the MRI gradient coil and includes a cooling circuit. A chiller is connected to the cooling circuit and configured to pump a coolant through the cooling circuit and extract heat from the coolant. The coolant includes both a carrier fluid and a phase-change material.

In accordance with another aspect of the present invention, a method of fabricating an MRI apparatus includes providing a fluid agent that includes a carrier fluid and a phase-transition material, pumping the fluid agent into an MRI gradient coil in order to extract heat generated within the MRI gradient coil via the fluid agent when in operation.

Yet another aspect of the present invention includes a cooling system for an MRI machine. The cooling system includes an MRI gradient coil, a cooling channel positioned within the MRI gradient coil, and a cooling medium positioned within the cooling channel. The cooling medium includes a liquid carrier and an interphase material.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
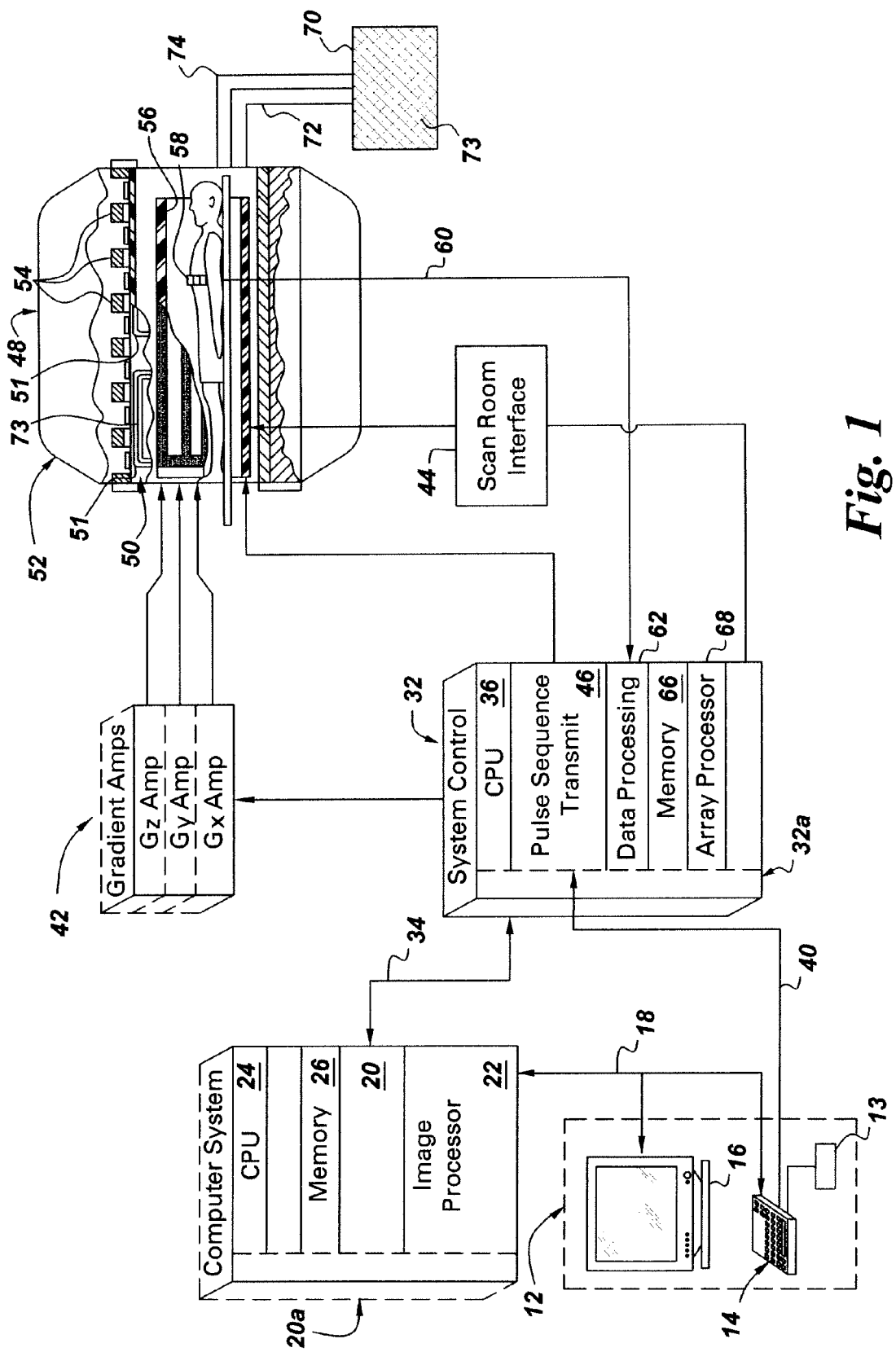
FIG. 1 is a schematic block diagram of an MR imaging system incorporating the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Gradient coil assembly 50 serves to control magnetic fields over the desired field of view and is excited by gradient amplifiers 42 to produce magnetic gradient fields. When generating the magnetic gradient fields, gradient coil assembly 50 produces heat, typically 15-20 kW, which should be dissipated to avoid MR system overheating. A series of cooling sub-circuits 51 are distributed throughout gradient coil assembly 50 and are attached to a chiller 70 via a supply line 72 and a return line 74. During normal operation of gradient coil assembly 50, chiller 70 pumps coolant 73 into supply line 72. The coolant 73 is distributed throughout the cooling sub-circuits 51, and heat generated by gradient coil assembly 50 is transferred into the coolant 73. Coolant 73 thereby typically rises in temperature to an extent proportional to a heat capacity of coolant 73. Cooling sub-circuits 51 are connected to gradient coil assembly 50 through return line 74. The coolant 73 is cooled within chiller 70 and continuously re-circulated through feed line 72.

The cooling of gradient coil assembly 50 may be enhanced by use of a phase-change material. A phase-change material can be used as a latent thermal storage device that changes from solid to liquid and vice-versa, and liquid to gas and vice-versa. The phase-change material may otherwise be known as an interphase or phase-transition material. Unlike a conventional heat storage material such as water, ethylene glycol, or a mix thereof, when a phase-change material is employed for heat storage or as a heat transfer medium, energy must be externally applied to overcome the molecular attractions of the phase-change material, thus resulting in a change in state, or "phase." While undergoing a phase change, a material absorbs energy while remaining isothermal.

A property of a phase-change material is quantified by what is known in the art as the "latent heat of fusion" when a phase-change is from solid to liquid, and vice-versa. Materials that exhibit this behavior and are typically used for heat transfer purposes are commonly salts, soda ash, sodium acetate, and paraffin wax, to name a few. A phase-change from liquid to vapor is quantified by what is known in the art as the "latent heat of vaporization." Materials that exhibit this behavior and are typically used for heat transfer purposes include soaps, detergents, and other compounds whose basic structure is a paraffin chain.

Figure 2:
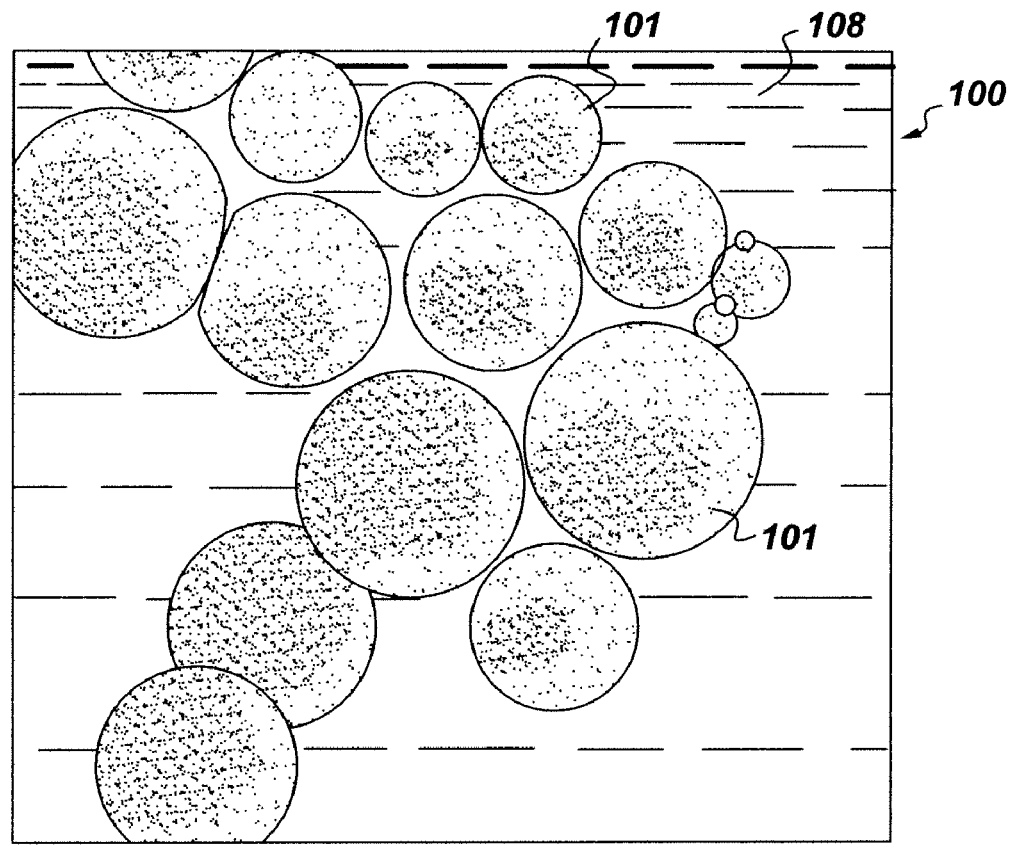
FIG. 2 is a schematic representation of a cooling slurry in accordance with an embodiment of the present invention.

FIG. 2 shows a cooling substance, or slurry, 100 according to an embodiment of the present invention. The cooling substance 100 can equivalently be a fluid agent or cooling medium. Slurry 100 comprises materials 101 that are disbursed throughout a carrier fluid 108. Carrier fluid 108 typically has a vaporization temperature above a maximum operating temperature of gradient coil assembly 50, and a freezing temperature below a minimum temperature achieved in chiller 70. The amount of heat that can be absorbed by cooling substance 100 may take advantage of the latent heat of fusion or the latent heat of vaporization of materials 101 to isothermally absorb energy.

Figure 3:
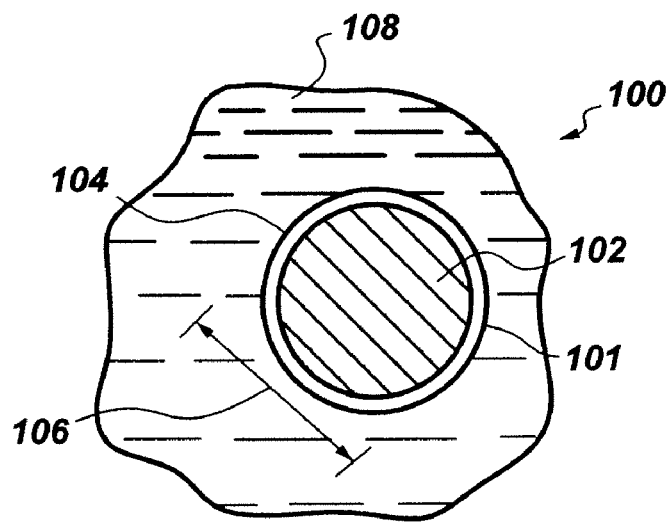
FIG. 3 is a schematic representation of a micro-encapsulated phase-change material in accordance with an embodiment of the present invention.

FIG. 3 shows a detailed view of a portion of slurry 100, exemplifying the latent heat of fusion of a material for cooling an MR gradient coil according to an embodiment of the present invention. Slurry 100 includes a phase-transition, or phase-change material 102 encapsulated by an outer shell 104, thus forming a micro-encapsulated phase-change material (MEPCM), or micro-encapsulated ball or globule. Slurry 100 also includes carrier fluid 108 such as water, ethylene glycol, and the like. It has been determined that paraffin wax is a good medium for phase-change material 102. Outer shell 104 typically includes a thin polymer that encapsulates the core, or phase-change material 102 and ranges in diameter 106 between approximately 5 and 25 microns. Slurry 100 is pumped as coolant 73 throughout cooling sub-circuits 51 by use of the chiller 70, thus delivering a plurality of phase-change materials 101 in a solid state to the gradient coil assembly 50. Accordingly, outer shell 104 must be a durable material that can be pumped over a long life cycle without breaking down or otherwise exposing phase-change material 102 to carrier fluid 108.

The phase-change material 102 may be tailored to specific applications. Paraffin wax used as the phase-change material, for instance, may be selected to achieve a melt temperature, or phase-change temperature, that is below that of the operating temperature of gradient coil assembly 50, which typically ranges from 60° C. to 150° C. As an example, for a 80° C. coil temperature, a desired phase change may be in the range of 25-70° C. such that adequate temperature difference between the gradient coil assembly 50 and phase-change material 102 is present to cause the phase-change. A gradient coil assembly may require a phase-change temperature ranging from, but not limited to, −50° C. to +100° C.

Likewise, the material of outer shell 104, typically a polymer, is selected such that it does not melt at or below the expected maximum operating temperature of the gradient coil assembly 50. Accordingly, outer shell 104 will typically remain as a solid during circulation through gradient coil assembly 50, and will contain phase-change material 102 whether in solid phase or liquid phase. Phase-change materials 102 are thereby prevented from agglomerating within carrier fluid 108. Furthermore, the thermal conductivity of the bulk polymer material comprising the outer shell 104 may be increased by addition of high conductivity powders to the polymer such as boron nitride, graphite, and the like. Accordingly, when materials 101 are pumped throughout a cooling circuit as in, for instance cooling sub-circuits 51 of gradient coil assembly 50, the slurry 100 will not cause performance degradation of a pumping mechanism within chiller 70.

In operation, coolant 73 of FIG. 2 is caused to flow throughout the cooling sub-circuits 51 of FIG. 1 of gradient coil assembly 50. Chiller 70 causes coolant 73 to be cooled, thereby causing phase-change material 102 contained within outer shell 104 to proceed through a phase-change, thus solidifying phase-change material 102 of each phase-change material 101. Upon completion of the phase-change of phase-change material 102, chiller 70 may further cause each phase-change material 102 to cool below the temperature at which phase-change of phase-change material 102 occurs.

Coolant 73 is pumped throughout the cooling sub-circuits 51 of FIG. 1 by chiller 70, which feeds coolant 73 into the gradient coil assembly 50 through feed line 72, wherein coolant 73 is directed through cooling sub-circuits 51. Heat generated within coil assembly 50 is thus transferred to coolant 73, including to phase-change material 102 within coolant 73. Accordingly, the phase-change material 102 within outer shell 104 is caused to proceed through a phase-change, and will absorb an amount of energy that is proportional to a latent heat of fusion of phase-change material 102, at which point phase-change material 102 will become fully liquid. Typically, prior to becoming fully liquid, however, the materials 101 are caused to exit the gradient coil assembly 50 through return line 74, and are returned to chiller 70 to be cooled and re-solidified. One skilled in the art will recognize that coolant 73 may be caused to exit the gradient coil assembly 50 after phase-change material 102 within coolant 73 has become fully liquid and after coolant 73 has thereby risen in temperature above the phase-change temperature of phase-change material 102. Cooling gradient coil assembly 50 is thus cooled using a material that absorbs an amount of energy that utilizes the material's latent heat of fusion to efficiently cool gradient coil assembly 50.

According to another embodiment of the present invention, material 101 may include an aqueous emulsion having a liquid therein that utilizes a latent heat of vaporization to absorb energy generated within gradient coil assembly 50. Such material may include an emulsion having, referring again to FIG. 2, a liquid as material 101 disbursed in carrier fluid 108. An emulsion is a suspension of small globules of a first liquid contained within a second liquid, which will not mix with the first liquid. A typical example is an oil in vinegar emulsion, which separates if left standing still, but will emulsify if churned during, for instance, pumping through a pump of a chiller assembly. Typical examples further include soaps, detergents, and other compounds whose basic structure is a paraffin chain.

In this embodiment, slurry 100 includes material 101 that is a first liquid having a phase-transition, or phase-change temperature selected to have a vaporization temperature, or phase-change temperature, that is below that of the operating temperature of gradient coil assembly 50.

During operation, coolant 73 is caused to flow throughout the cooling sub-circuits 51 of gradient coil assembly 50. Chiller 70 causes coolant 73 to be cooled, thereby causing the material 101 within coolant 73 to proceed through a phase-change, thus vaporizing the first liquid within the carrier fluid 108. Coolant 73 is caused to be pumped throughout the system by chiller 70, which feeds the coolant 73 into the gradient coil assembly 50 through feed line 72, wherein coolant 73 is then directed through cooling sub-circuits 51. Heat generated within coil assembly 50 is thus transferred to the coolant 73 and to the first emulsive material therein. Accordingly, the first emulsive material is caused to proceed through a phase-change, and will absorb an amount of energy that is proportional to a latent heat of vaporization of the first emulsive material, at which point the first emulsive material will become fully vapor. Typically, prior to becoming fully vapor, however, the first emulsive material is caused to exit the gradient coil assembly 50 through return line 74, and is fed back into chiller 70 to be cooled and re-liquified. One skilled in the art will recognize that coolant 73 may be caused to exit the gradient coil assembly 50 before phase-change of is complete, or coolant 73 may be caused to exit the gradient coil assembly 50 after full phase-change of phase-change material 101. Cooling gradient coil assembly 50 is thus cooled using a material that absorbs an amount of energy that utilizes the material's latent heat of vaporization to efficiently cool gradient coil assembly 50.

Coolant 73 comprising either a MEPCM or an emulsion, when going through a temperature change that includes a phase change, will absorb an amount of energy well in excess of a fluid that utilizes only its heat capacity through a similar temperature change. Accordingly, cooling sub-circuits 51 may be designed smaller or, conversely, may have additional cooling capability above that of normal coolants. Because coolant 73 passes through gradient coil assembly 50 during the phase-change of coolant 73 and the temperature of coolant 73 remains substantially constant, pumping requirements remain substantially constant as well throughout sub-circuits 51. Finally, because coolant 73 remains at substantially the same temperature throughout sub-circuits 51, gradient coil assembly 50 will not experience hot spots that will degrade system performance.

Coolant 73 comprising slurry 100 may settle or stratify between uses of chiller 70 or MRI system 10, thereby needing to be mixed prior to being pumped through coil assembly 50. Chiller 70 may include a mixer such as an ultrasonic, a piezo-actuator or other vibrational device to mix coolant 73 prior to being pumped into feed line 72. The mixer pre-mixes the slurry 100 containing either MEPCMs or an emulsion to a substantially uniform consistency prior to being pumped into feed line 72. The mixer may be enclosed within chiller 70 or may be remotely located (not shown) as part of the overall cooling circuit, and thus may be wall-mounted or otherwise remotely located from the chiller 70.

An embodiment of the present invention provides a system and method to increase heat removal from the gradient coil assembly 50 of MR system 10, while maintaining gradient coil temperatures below maximum allowable operating limits. Accordingly higher power applications and longer scan durations may be achieved while maintaining uniform temperatures throughout the gradient coil assembly 50, eliminating hot spots, and reducing coolant pumping requirements.

Therefore, according to one embodiment of the present invention, an MRI apparatus includes a MRI gradient coil and an MRI cooling system. The MRI cooling system is thermally connected to the MRI gradient coil and includes a cooling circuit. A chiller is connected to the cooling circuit and configured to pump a coolant through the cooling circuit and extract heat from the coolant. The coolant includes both a carrier fluid and a phase-change material.

In accordance with another embodiment of the present invention includes providing a fluid agent that includes a carrier fluid and a phase-transition material, pumping the fluid agent into an MRI gradient coil in order to extract heat generated within the MRI gradient coil via the fluid agent when in operation.

Yet another embodiment of the present invention includes a cooling system for an MRI machine. The cooling system includes an MRI gradient coil, a cooling channel positioned within the MRI gradient coil, and a cooling medium positioned within the cooling channel. The cooling medium includes a liquid carrier and an interphase material.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
   a MRI gradient coil; and
   an MRI cooling system thermally connected to the MRI gradient coil comprising:
   a cooling circuit;
   a coolant comprising:
      a carrier fluid;
      a phase-change material; and
      a plurality of micro-encapsulated balls, each micro-encapsulated ball having a polymer coating enclosing an amount of the phase-change material and wherein during operation of the MRI apparatus the polymer coating is in a solid phase and the phase-change material is capable of undergoing a phase-change; and
   a chiller connected to the cooling circuit and configured to pump the coolant through the cooling circuit and extract heat from the coolant.

2. The MRI apparatus of claim 1 wherein the carrier fluid is slurry comprised of water and ethylene glycol.

3. The MRI apparatus of claim 2 wherein the inlet temperature and the outlet temperature of the slurry are substantially equal.

4. The MRI apparatus of claim 2 wherein the slurry is an aqueous emulsion.

5. The MRI apparatus of claim 4 wherein the phase-change material has a vaporization temperature below an operating temperature of the MRI gradient coil.

6. The MRI apparatus of claim 1 wherein the polymer coating comprises a thermally conductive material embedded therein.

7. The MRI apparatus of claim 6 wherein the thermally conductive material is one of boron nitride and graphite.

8. The MRI apparatus of claim 1 wherein a diameter of each of the plurality of micro-encapsulated balls is preferably less than 25 microns in thickness.

9. The MRI apparatus of claim 1 wherein the phase-change material is wax.

10. The MRI apparatus of claim 9 wherein a phase-change temperature of the wax is between −50 to +100° C.

11. The MRI apparatus of claim 1 wherein the phase-change material has a phase-change temperature below an operating temperature of the MRI gradient coil.

12. A method of fabricating an MRI apparatus, the method comprising providing a fluid agent that includes:
   a carrier fluid;
   a phase changing material; and
   a plurality of micro-encapsulated balls, each micro-encapsulated ball having a polymer coating enclosing an amount of the phase-change material and wherein during operation of the MRI apparatus the polymer coating is in a solid phase and the phase-change material is capable of undergoing a phase-change; and
   pumping the fluid agent into an MRI gradient coil to extract heat generated within the MRI gradient coil via the fluid agent when the MRI apparatus is in operation.

13. The method of claim 12 further comprising attaching a chiller to the fluid agent and extracting heat from the fluid agent via the chiller.

14. The method of claim 12 wherein the phase-transition material is wax.

15. The method of claim 12 wherein pumping the fluid agent further comprises pumping the carrier fluid in liquid state and pumping the phase-transition material in liquid state when both enter into the MRI gradient coil.

16. The method of claim 12 wherein the fluid agent is contained within substantially rounded globules, the globules having an outer skin comprising a polymer.

17. A cooling system configured for an MRI machine, the cooling system comprising:
   an MRI gradient coil;
   a cooling channel positioned within the MRI gradient coil;
   a cooling medium positioned within the cooling channel, the cooling medium comprising:
      a carrier fluid;
      a phase changing material; and
      a plurality of micro-encapsulated balls, each micro-encapsulated ball having a polymer coating enclosing an amount of the phase-change material and wherein during operation of the MRI apparatus the polymer coating is in a solid phase and the phase-change material is capable of undergoing a phase-change.

18. The cooling system of claim 17 wherein the interphase material has a phase transition temperature below an operating temperature of the MRI gradient coil.

19. The cooling system of claim 17 wherein the cooling medium is one of a liquid having a solid phase-change material disposed therein, and an emulsion comprising two liquids.

20. The cooling system of claim 17 further comprising a mixer to mix the cooling medium to a to a substantially uniform consistency.

21. The cooling system of claim 20 wherein the mixer comprises one of an ultrasonic, piezoactuator vibrational device.

* * * * *